United States Patent [19]
Sitaram et al.

[11] Patent Number: 5,384,285
[45] Date of Patent: Jan. 24, 1995

[54] PROCESS FOR FABRICATING A SILICIDE LAYER IN A SEMICONDUCTOR DEVICE

[75] Inventors: Arkalgud Sitaram; Papu D. Maniar; Jeffrey T. Wetzel, all of Austin, Tex.

[73] Assignee: Motorola, Inc., Schaumburg, Ill.

[21] Appl. No.: 96,809

[22] Filed: Jul. 26, 1993

[51] Int. Cl.⁶ .................. H01L 21/44; H01L 21/48
[52] U.S. Cl. .................. 437/200; 148/DIG. 113; 148/DIG. 145
[58] Field of Search .......... 437/200, 235, 247; 148/DIG. 113, DIG. 145, DIG. 15

[56] References Cited

U.S. PATENT DOCUMENTS 4,923,822  5/1990  Wang et al. ..................... 437/41
4,960,732  11/1990  Dixit et al. ..................... 437/192

Primary Examiner—Olik Chaudhuri
Assistant Examiner—C. Everhart
Attorney, Agent, or Firm—Jasper W. Dockrey

[57] ABSTRACT

A transition-metal silicide process includes the formation of a boron nitride capping layer overlying a transition-metal layer. In one embodiment, a transition-metal layer (30) is deposited onto a silicon surface (22), and onto a polysilicon gate electrode (12). A capping layer (32), which can be either boron nitride or boron oxynitride is deposited onto the transition-metal layer (30), and an annealing process is carried out to form a transition-metal/silicon alloy layer (34, 36, 38) at the silicon surface (22), and on the gate electrode (12). The capping layer (32) overlies the transition-metal layer (30) during the annealing process and prevents the formation of an oxide layer at the silicon surfaces (22, 12). After the annealing process is complete, the capping layer (13) is removed by a selective wet etch process, and a second annealing step is carried out to form a transition-metal silicide layer (40, 42, 44).

14 Claims, 3 Drawing Sheets

PROCESS FOR FABRICATING A SILICIDE LAYER IN A SEMICONDUCTOR DEVICE

FIELD OF THE INVENTION

This invention relates, in general, to a method for fabricating a semiconductor device, and more particularly, to a method for forming a transition-metal silicide layer in a semiconductor device.

BACKGROUND OF THE INVENTION

To facilitate the need for smaller contact geometries in VLSI devices, transition-metal silicides have been used to provide a highly-conductive body having a shallow junction depth in a silicon substrate. As both the contact size and junction depth are reduced, a new device metallization processes are required to overcome the problems which are encountered.

One such recent device metallization process is the self-aligned silicide process (salicidation). In the salicidation process, a transition-metal layer is deposited to overlie device regions to which an electrical connection are to be made. The transition-metal layer also overlies insulating layers on the surface of the device substrate. The substrate is then annealed at a high temperature to form a conductive silicide layer at the surface of the device region. The silicide is formed by a reaction between the transition-metal, and silicon in the underlying device region. In areas in which the transition-metal layer overlies a dielectric material, no substantial chemical reaction occurs between the transition-metal and the dielectric material. Following the silicide forming reaction, remaining portions of the transition-metal which did not react with silicon are removed. Thus, an electrically conductive silicide material is formed only in areas where the transition-metal directly contacts a silicon device region. The salicidation process avoids the need to pattern the transition-metal prior to forming a silicide layer, making the formation of smaller electrical contacts possible.

Typically, either titanium or cobalt are used as the transition-metal in the salicidation process. These transition-metals readily react with silicon to form titanium silicide ($TiSi_2$), and cobalt silicide ($CoSi_2$), and the silicides of cobalt and titanium have good thermal stability. Additionally, these transition-metals can be readily deposited by existing, well characterized metal deposition processes such as physical and chemical vapor deposition.

Typically, the annealing process used to form the transition-metal silicide is carried out in either a conventional furnace, or a rapid thermal annealing apparatus. It is during the annealing process that the transition-metal reacts with silicon to form the transition-metal silicide. To avoid oxide formation during the reaction, the annealing system is purged and nitrogen, or another inert gas, is introduced to the annealing system. In the case of titanium, the titanium also reacts with nitrogen and forms titanium nitride (TiN). Although titanium nitride is electrically conductive, the formation of titanium nitride reduces the amount of titanium available for reaction with silicon to form titanium silicide. Additionally, any oxygen present in the annealing system can react with the transition-metal to form a transition-metal oxide. Also, oxygen can diffuse, to a certain extent, through the transition-metal to the silicon interface and react with silicon to form silicon dioxide. Either of these reactions produce an electrically insulating material which increases the contact resistance in the device regions. The necessity of removing even trace amounts of oxygen from the annealing system requires a leak proof system and a high flow rate of very pure nitrogen gas during the annealing process. The stringent process conditions result in high processing costs and poor repeatability of the silicide formation process.

To reduce the adverse effects associated with unwanted transition-metal reactions, a capping layer can be used to overlie the transition-metal layer. A capping layer can reduce the exposure of the transition-metal to ambient gases and oxygen during the silicide formation process. To be effective, the capping layer must not substantially react with the underlying transition-metal layer, and must be easily removable following the silicide formation process. Additionally, the capping layer must provide a diffusion barrier to oxygen and ambient gas molecules. Both insulating and conductive materials have been used as capping layers in silicide formation processes. For example, silicon dioxide, deposited using tetraethylorthosilane (TEOS), can be formed on a transition-metal layer to prevent a reaction between ambient gases and the transition-metal. However, the oxygen in silicon dioxide can react with the transition-metal and form an oxide at the interface between the transition-metal and the silicon dioxide. Additionally, the TEOS layer must be removed with a highly selective etch which will not damage the underlying transition-metal silicide.

An electrically conductive material such as titanium nitride can also be used as a capping layer. Titanium nitride provides a good barrier to the diffusion of ambient gases to the silicon surface during the silicide formation process. However, titanium nitride can react with oxygen to form titanium oxynitride, which is difficult to remove. Also, titanium oxynitride reduces the diffusion barrier capability of the titanium nitride layer. Accordingly, further development of capping layers is required to provide a capping layer which can be easily removed following silicide formation, and which provides a barrier to the diffusion of both oxygen and ambient gases during the silicide formation process.

SUMMARY OF THE INVENTION

In practicing the present invention there is provided a process for fabricating a silicide layer in a semiconductor device. The silicide formation process, performed in accordance with the invention, provides a silicided device region in which a substantial portion of the initially deposited transition-metal is converted to a transition-metal silicide. In one embodiment, a substrate is provided having a silicon surface. Then, a transition-metal layer is provided to overlie the silicon surface, and a capping layer selected from the group consisting of boron nitride and boron oxynitride is provided to overlie the transition-metal. Components of the transition-metal layer are then reacted with the silicon in the silicon surface to form a transition-metal silicide layer. The capping layer is deposited at a relatively low temperature such that unwanted side-reactions are avoided. The capping layer increases the conversion of the transition-metal to a transition-metal silicide by reducing non-silicide forming reactions. Additionally, following the silicide formation process, the capping layer is readily removed by a simple wet etching process. The silicide formation process performed in accordance with the invention results in minimal loss of transition-metal, and is easily integrated into existing semiconductor fabrication processes.

Figure 1:
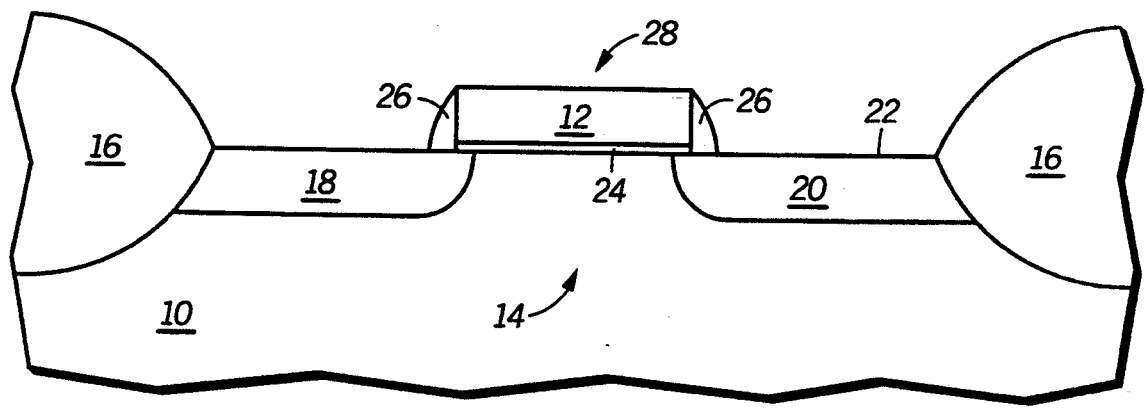
FIGS. 1-4 illustrate, in cross section, process steps in accordance with one embodiment of the invention for the fabrication of an MOS transistor.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

DETAILED DESCRIPTION OF THE PREFERRED EMBODIMENTS

The present invention provides an improved process for the fabrication of a transition-metal silicide layer. The process attains a high degree of efficiency in converting transition-metal to transition-metal silicide by providing a capping layer, which can be boron nitride (BN) or boron oxynitride (BNO), over the transition-metal. The capping layer prevents contaminants from diffusing through the transition-metal layer and to the interface between the transition-metal layer and the silicon substrate. By preventing the diffusion of contaminants during the transition-metal silicide formation process, a substantially higher conversion rate of transition-metal to transition-metal silicide is obtained. Furthermore, the capping layer has the advantage that it can be easily etched away from the transition-metal silicide without damaging the newly formed silicide layer. The wet etching process preferably used to remove the capping layer, also removes any residual, unreacted portions of the transition-metal layer.

FIGS. 1-4 illustrate the application of the invention to the fabrication of a semiconductor device, specifically, an MOS transistor. Only those process steps necessary for explaining the invention are illustrated and described. The process, of course, may include other steps which are necessary for the fabrication of a completed device, but which do not involve the invention. To avoid confusion, these steps which are conventionally used in semiconductor processing have not been shown.

FIG. 1 illustrates, in cross-section, a portion of semiconductor substrate 10 having already undergone several process steps in accordance with one embodiment of the invention. Substrate 10 can be a monolithic (100) silicon substrate. Additionally, substrate 10 can be a monocrystalline silicon substrate having an epitaxial silicon layer overlying the monocrystalline silicon substrate. Further, substrate 10 can be a silicon-on-insulator type substrate having an epitaxial layer overlying an insulating layer. A gate electrode 12 overlies an active region 14 in substrate 10. Gate electrode 12 is preferably polycrystalline silicon, which has been doped by a conductivity determining dopant to have a low electrical resistance. Source and drain regions 18 and 20, respectively, reside in substrate 10 on either side of gate electrode 12. Source and drain regions 18 and 20 are preferably formed by ion implanting a conductivity determining dopant into a surface region 22 of substrate 10. Alternatively, source and drain regions 18 and 20 can be formed by a diffusion process. A gate dielectric layer 24 underlies gate electrode 12, and insulating side wall spacer 26 overlies the edge of gate electrode 12. Those skilled in the art will recognize the previously described components as comprising an MOS transistor, denoted as transistor 28. Depending upon conductivity of the particular dopant used to form source and drain regions 18 and 20, MOS transistor 28 can have either an N-type conductivity, or a P-type conductivity. In a preferred embodiment, source and drain regions 18 and 20 are formed by ion implantation of an N-type dopant such as phosphorous or arsenic. Further, gate electrode 12 is also preferably doped with an N-Type dopant such as phosphorous.

Figure 2:
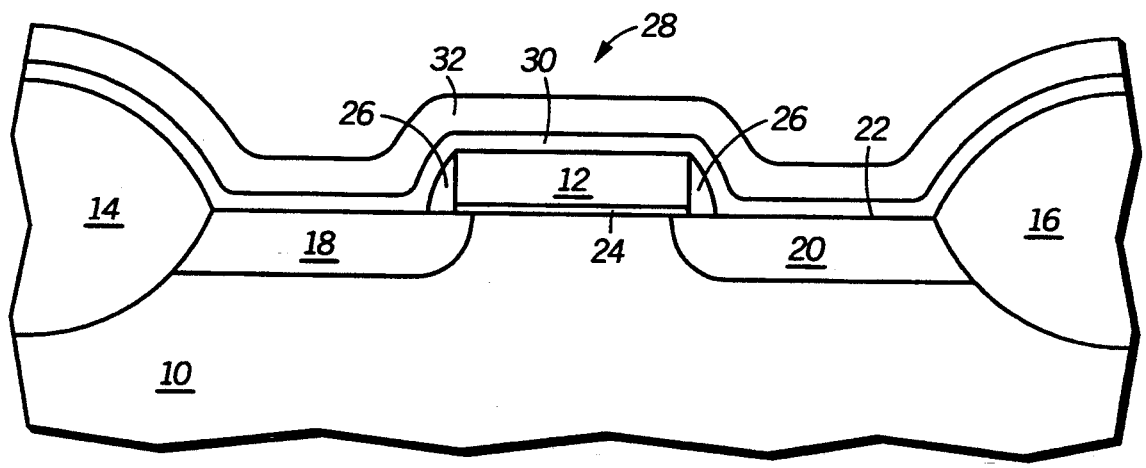

The process continues, as illustrated in FIG. 2, with the deposition of a transition-metal layer 30. Transition-metal layer 30 is preferably either titanium or cobalt, and is deposited to overlie substrate surface 22 and gate electrode 12. Preferably, transition-metal layer 30 is sputter deposited in an RF sputter deposition system, using an argon ambient. Alternatively, transition-metal layer 30 can be formed by a chemical vapor deposition process.

Once transition-metal layer 30 has been deposited, a capping layer 32 is formed to overlie transition-metal layer 30. Preferably, capping layer 32 is either boron nitride, formed by a low temperature deposition process, or boron oxynitride (BNO). In one embodiment, capping layer 32 is formed by a chemical vapor deposition process employing diborane ($B_2H_6$), ammonia ($NH_3$), and nitrogen ($N_2$). The chemical vapor deposition process is carried out preferably at a temperature ranging from 200° to 400° C. Alternatively, the boron nitride deposition can be carried out by sputtering boron nitride from a composite sputter target at room temperature. And yet another alternative deposition process, boron nitride layer 32 is formed by a spin on glass process. Boron oxynitride is preferably deposited by plasma enhanced chemical vapor deposition (PECVD) using $B_2H_6$, $NH_3$, $N_2$, and nitrous oxide ($N_2O$) source gases. The deposition is preferably carried out at a temperature of about 200° to 500° C., and most preferably at 400° C.

Figure 3:
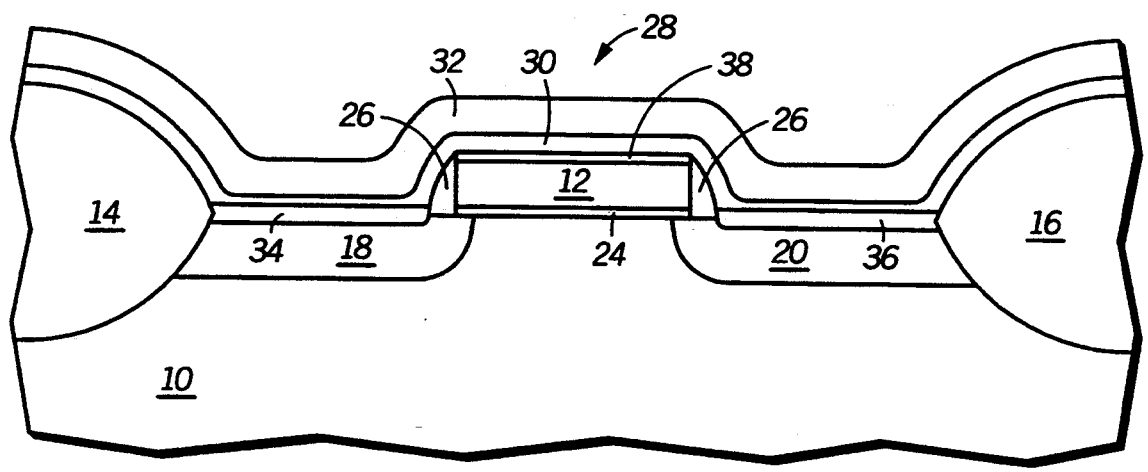

Following the deposition of capping layer 32, substrate 10 is annealed in an inert gas ambient preferably at about 600° to 700° C., and most preferably at about 625° C., for a period of about 30 to 60 minutes. The annealing process forms transition-metal/silicon alloy layers 34 and 36 at substrate surface 22, as illustrated in FIG. 3. Additionally, the annealing process forms a transition-metal/polysilicon alloy 38 at the upper surface of gate electrode 12. The annealing step is preferably carried out in a conventional annealing furnace. Alternatively, the annealing step can be carried out in a rapid thermal processing system.

After forming the alloy layers, capping layer 32, which, in the case of boron nitride, has been at least partially converted to boron oxynitride, is stripped off in a wet etching solution. Preferably the wet etching solution is a solution of sulfuric acid ($H_2SO_4$) and hydrogen peroxide ($H_2O_2$). The wet etch is preferably performed at a bath temperature of about 85° to 110° C., and most preferably at 90° C. Alternatively, other wet etch solutions can be used, such as ammonium hydroxide (NH$_4$OH) and H$_2$O$_2$, and the like. The wet etching solution removes both boron nitride, including boron oxynitride, and unreacted transition-metal remaining at the surface of the transition-metal/silicon alloy.

Figure 4:
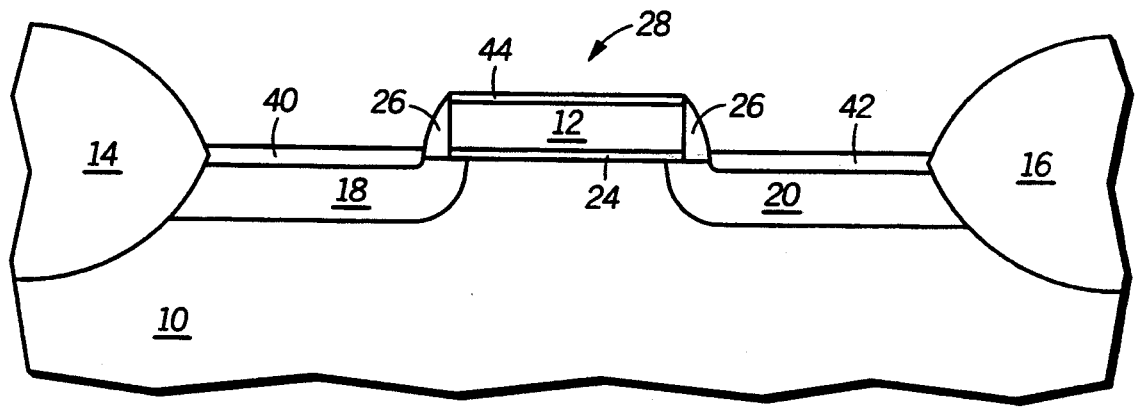

Following the removal of capping layer 32 and unreacted transition-metal, preferably, a second annealing step is carried out to convert the alloy to transition-metal silicide. As illustrated in FIG. 4, transition-metal silicide layers 40 and 42 overlie source and drain regions 18 and 20, respectively, and transition-metal silicide layer 44 overlies gate electrode 12. The final annealing step can be performed in a conventional annealing furnace, or alternatively, in a rapid thermal annealing apparatus. The final annealing cycle reduces the sheet resistance of the titanium silicide layer. In an alternative embodiment, the titanium can be annealed in a single step to form a titanium silicide layer. During the annealing step, the alloy is formed and converted to a silicide in a continuous process. Subsequent processing steps can be conventionally carried out to provide a passivation layer overlying MOS transistor 28, and contact holes can be formed in the passivation layer to allow for the formation of electrical contacts to source and drain regions 18 and 20, and to gate electrode 12.

The inventive salicide process facilitates the formation of electrical contacts to silicide regions 40, 42, and 44 having a low electrical contact resistance. In the fabrication of MOS devices, the speed at which transistors such as MOS transistor 28 can be switched on and off, and accessed electrically, directly impacts device performance. Ideally, the electrical contact resistance to contacts made to silicide regions, such as regions 40, 42, and 44, should offer the lowest electrical resistance of any point in electrical circuits fabricated in the device. Contacts such as these are known as "ohmic" contacts. The boron nitride capping layer of the invention both prevents the formation of oxide layers at the transition-metal/silicon substrate interface, and provides a large concentration of transition-metal in the transition-metal silicide layer itself. The high concentration of transition-metal, together with the absence of any oxide layers at the substrate interface, promotes the formation of ohmic contacts to silicide regions 40, 42, and 44. Additionally, the easy removal of the boron nitride capping layer by means of a conventional wet etch enables the boron nitride capping layer to be easily integrated into a conventional MOS device fabrication process. Because the wet etching process used to remove the boron nitride capping layer also removes excess transition-metal remaining after the silicide formation reaction, unwanted transition-metal oxide residues are avoided. Since all residual transition-metal is removed by the wet etching process, reactions between excess transition-metal and oxygen to form an electrically resistive transition-metal oxide are avoided.

The foregoing specific and non-limiting embodiment of the invention illustrates the chemical interactions occurring during the inventive silicide formation process. However, the process of the invention can include other materials and structures than those illustrated in the foregoing embodiment Without further elaboration, it is believed that one skilled in the art can, using the preceding description, utilize the invention to its fullest extent. The following preferred specific embodiments are, therefore, to be construed as merely illustrative, and not limitative of the remainder of the disclosure in any way whatsoever.

EXAMPLE

A titanium layer was deposited onto a (100) silicon substrate to a thickness of about 400 angstroms in an RF sputter deposition apparatus using a pure titanium target in an argon ambient. A boron oxynitride layer was deposited to overlie the titanium layer. The boron oxynitride nitride layer was deposited to a thickness of about 400 angstroms by plasma enhanced chemical vapor deposition (PECVD) using diborane (B$_2$H$_6$), ammonia (NH$_3$), nitrogen (N$_2$), and nitrous oxide (N$_2$O) source gases at a temperature of about 400° C. The following PECVD deposition conditions were used: system pressure 5.25 torr; RF power 100 watts; susceptor spacing 420 mils; 1169 sccm B$_2$H$_6$(in H$_2$); 2631 sccm NH$_3$; and 36 sccm N$_2$O.

After depositing the boron oxynitride layer, the substrate was subjected to a thermal annealing process to form a titanium/silicon alloy at the substrate surface. The annealing process was carried out in an nitrogen-purged convection furnace at a temperature of about 625° C. and for about 60 minutes. Following the annealing process, the sheet resistance of the titanium/silicon alloy was measured with a four-point probe and determined to be about 5.4 ohms/square.

Figure 5:
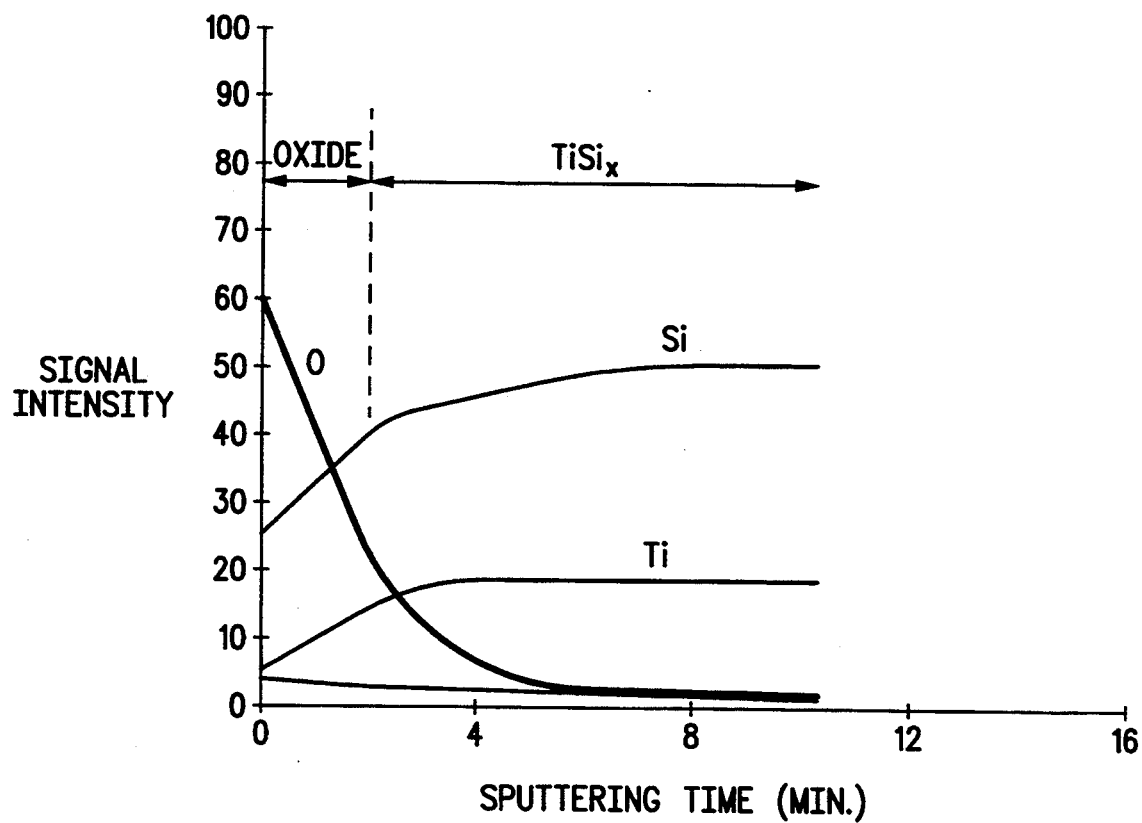
FIG. 5 is a plot showing a qualitative Auger depth analysis of a titanium/silicon alloy layer formed in accordance with the invention.

Following the initial annealing cycle, the boron oxynitride layer was removed by wet chemical etching in a solution of sulfuric acid (H$_2$SO$_4$) and hydrogen peroxide. The etch bath was maintained at a temperature of 90° C. during the etching process. A qualitative Auger depth analysis of the titanium/silicon alloy surface, taken after wet etching, indicates that the wet chemical etch also removed the unreacted titanium. The Auger spectrogram appears in FIG. 5.

After removing the boron oxynitride capping layer, the substrate was annealed in a rapid thermal annealing apparatus to fully covert the titanium/silicon alloy to stoichiometric titanium silicide (TiSi$_2$). The rapid thermal annealing process was carried out in a nitrogen ambient at a temperature of about 800° C., and for a period of about 40 seconds.

Figure 6:
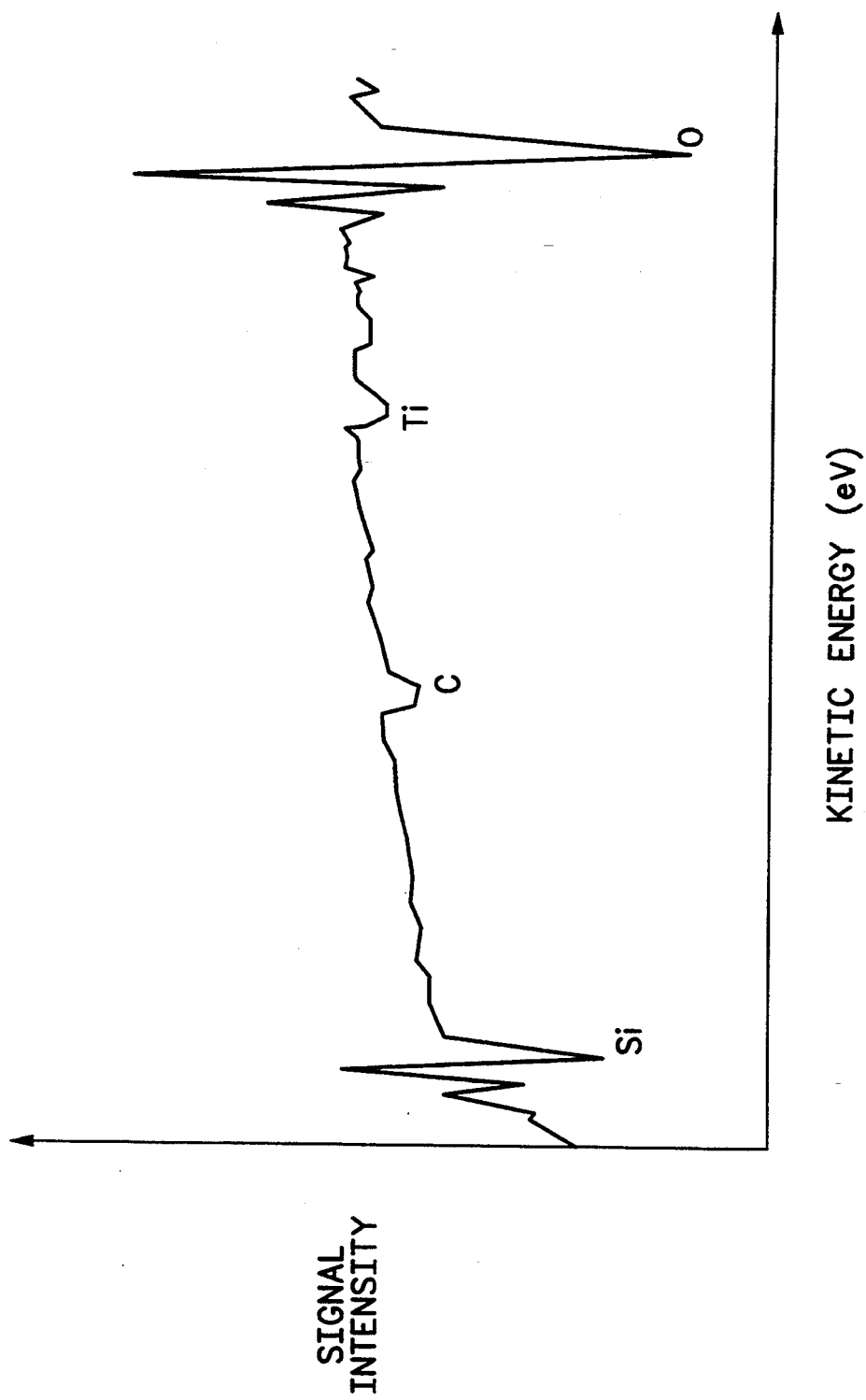
FIG. 6 is a surface Auger analysis spectrogram of a titanium silicide layer formed in accordance with the invention.

The chemical species present on the surface of the finally-annealed titanium silicide film were analyzed by surface Auger spectrography. The surface Auger spectrogram appears in FIG. 6. It is important to note that all nitrogen compounds have been removed by the wet etching process. The oxygen signal shown in the spectrogram originates from a native oxide which formed on the surface of the titanium silicide layer following the annealing process.

The extent of conversion of titanium to titanium silicide was determined by comparing the sheet resistance the annealed titanium silicide film, with the theoretical sheet resistance assuming complete conversion. The theoretical sheet resistance was calculated by first determining the theoretical maximum thickness of titanium silicide that could be formed from 400 angstroms of titanium, then multiplying by the known resistivity of titanium silicide, which is about 15 micro ohm-centimeters. The resulting theoretical value is 1.5 ohms/square. The annealed titanium silicide film was measured to be 1.7 ohms/square. This indicates that about 87.5% of the initially deposited titanium was converted to titanium silicide.

Thus it is apparent that there has been provided, in accordance with the invention, a process for fabricating a silicide layer in a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, if the initial annealing process used to form the transition-metal/silicon alloy is extended, a second annealing step to form the transition-metal silicide may be unnecessary. Furthermore, the processing conditions can differ substantially from those previously described. Processing temperatures and times can be different depending upon the particular characteristics of the processing equipment employed. It is therefore intended to include within the invention all such variations and modifications as fall within the scope of the appended claims and equivalents thereof.

We claim:

1. A process for fabricating a silicide layer in a semiconductor device comprising the steps of:
   providing substrate having a silicon surface;
   providing a transition-metal layer to overlie the silicon surface;
   providing a capping layer selected from the group consisting of boron nitride and boron oxynitride to overlie the transition-metal; and
   reacting components of the transition-metal layer with the silicon surface in an inert gas ambient to form a transition-metal silicide layer,
   wherein the capping layer is exposed to the ambient during formation of the silicide layer.

2. A process for fabricating a silicide layer in a semiconductor device comprising the steps of:
   providing substrate having a silicon surface;
   providing a transition-metal layer to overlie the silicon surface;
   providing a capping layer selected from the group consisting of boron nitride and boron oxynitride to overlie the transition-metal;
   subjecting the substrate to a first thermal annealing cycle to form a transition-metal/silicon alloy;
   removing the boron nitride layer; and
   subjecting the substrate to a second thermal annealing cycle to form the transition-metal silicide.

3. A process for fabricating a silicide layer in a semiconductor device comprising the steps of:
   providing substrate having a silicon surface;
   providing a transition-metal layer to overlie the silicon surface;
   depositing boron oxynitride by plasma enhanced chemical vapor deposition at a temperature of 200° to 500° C.; and
   reacting components of the transition-metal layer with the silicon surface to form a transition-metal silicide layer.

4. The process of claim 1, wherein the step of providing a capping layer comprises depositing boron nitride by a process selected from the group consisting of chemical vapor deposition and sputter deposition.

5. The process of claim 1, wherein the step of providing a transition-metal comprises depositing a transition-metal selected from the group consisting of titanium and cobalt.

6. A process for fabricating a silicide layer in a semiconductor device comprising the steps of:
   providing substrate having a silicon surface;
   providing a transition-metal layer to overlie the silicon surface;
   providing a capping layer selected from the group consisting of boron nitride and boron oxynitride to overlie the transition-metal;
   reacting components of the transition-metal layer with the silicon surface to form a transition-metal silicide layer; and
   removing the capping layer in a wet etch solution, the solution having components selected from the group consisting of sulfuric acid and hydrogen peroxide, or ammonium hydroxide and hydrogen peroxide.

7. A process for fabricating a silicide layer in a semiconductor device comprising the steps of:
   providing substrate having a silicon surface, a transition-metal layer overlying the silicon surface, and a capping layer selected from the group consisting of boron nitride and boron oxynitride overlying the transition-metal,
   wherein an interface resides between the transition-metal and the silicon surface;
   subjecting the substrate to a thermal process in a gas ambient, wherein a finite amount of oxygen is present; and
   forming a transition-metal silicide at the interface, wherein diffusion of oxygen to the interface is prevented, and
   wherein the capping layer is exposed to the ambient during formation of the silicide layer.

8. The process of claim 7, wherein the step of subjecting the substrate to a thermal process comprises thermal annealing in a nitrogen ambient at about 600° to 700° C.

9. The process of claim 7, wherein providing a transition-metal comprises chemical vapor deposition of a transition-metal selected from the group consisting of titanium and cobalt.

10. A process for fabricating a silicide layer in a semiconductor device comprising the steps of:
    providing substrate having a silicon surface, a transition-metal layer overlying the silicon surface, and a capping layer selected from the group consisting of boron nitride and boron oxynitride overlying the transition-metal,
    wherein an interface resides between the transition-metal and the silicon surface;
    subjecting the substrate to a thermal process,
    wherein the thermal process comprises rapid thermal annealing in an inert ambient, and
    wherein a finite amount of oxygen is present; and
    forming a transition-metal silicide at the interface, wherein diffusion of oxygen to the interface is prevented.

11. A process for fabricating a silicide layer in a semiconductor device comprising the steps of:
    providing a substrate having a silicon surface;
    depositing a transition-metal layer to overlie the silicon surface;
    depositing a capping layer selected from the group consisting of boron nitride and boron oxynitride to overlie the transition-metal;
    annealing the substrate in an inert gas ambient to substantially convert the transition-metal to a transition-metal/silicon alloy;
    etching away the capping layer; and
    annealing the transition-metal/silicon alloy to form a transition-metal silicide layer.

12. The process of claim 11, wherein the step of etching away the capping layer comprises subjecting the substrate to a solution of sulfuric acid and hydrogen peroxide.

13. The process of claim 12, wherein the solution is maintained at a temperature of 85° to 110° C.

14. The process of claim 11, wherein the step of annealing to form a transition-metal silicide comprises rapid thermal annealing in an inert gas ambient.

* * * * *